United States Patent
Lin et al.

(10) Patent No.: US 7,902,600 B2
(45) Date of Patent: Mar. 8, 2011

(54) METAL OXIDE SEMICONDUCTOR DEVICE

(75) Inventors: Shin-Kuang Lin, Hsinchu (TW); Lung-Chih Wang, Hsinchu County (TW); Chung-Ming Huang, Taichung County (TW); Che-Ching Yang, Taipei (TW); Chun-Ming Chen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 231 days.

(21) Appl. No.: 12/332,977

(22) Filed: Dec. 11, 2008

(65) Prior Publication Data

US 2010/0148250 A1      Jun. 17, 2010

(51) Int. Cl.
*H01L 29/78* (2006.01)
(52) U.S. Cl. .......... 257/335; 257/288; 257/E29.256
(58) Field of Classification Search .......... None
See application file for complete search history.

(56) References Cited

U.S. PATENT DOCUMENTS

| 6,822,296 | B2 | 11/2004 | Wang |
| 7,091,079 | B2 | 8/2006 | Chen et al. |
| 7,755,147 | B2 * | 7/2010 | Satoh .......................... 257/371 |
| 2005/0227448 | A1 | 10/2005 | Chen et al. |
| 2007/0132033 | A1 | 6/2007 | Wu et al. |

\* cited by examiner

*Primary Examiner* — Davienne Monbleau
*Assistant Examiner* — Monica D Harrison
(74) *Attorney, Agent, or Firm* — J.C. Patents

(57) ABSTRACT

A metal oxide semiconductor device comprising a substrate, at least an isolation structure, a deep N-type well, a P-type well, a gate, a plurality of N-type extension regions, an N-type drain region, an N-type source region and a P-type doped region is provided. The N-type extension regions are disposed in the substrate between the isolation structures and either side of the gate, while the N-type drain region and the N-type source region are respectively disposed in the N-type extension regions at both sides of the gate. The P-type well surrounds the N-type extension regions, and the P-type doped region is disposed in the P-type well of the substrate and is isolated from the N-type source region by the isolation structure.

9 Claims, 3 Drawing Sheets

METAL OXIDE SEMICONDUCTOR DEVICE

BACKGROUND OF THE INVENTION

1. Field of the Invention

The present invention relates to a semiconductor device. More particularly, the present invention relates to a metal oxide semiconductor (MOS) device.

2. Description of the Related Art

Liquid crystal display (LCD) has become the main stream of the display apparatuses. Due to its advantages of lightweight, compact, applicable in various sizes and low radiation, the LCD is suitably used as the display screen for portable electronic apparatuses such as the notebooks, the mobile phones and global positioning systems (GPS) etc.

Owing to the limited power capacity of the battery, it is desirable for the LCDs used in the portable electronic apparatuses to offer lower electricity consumption. However, as the size of the LCD panels keeps increasing, the electricity consumption is inevitably increased.

In general, high voltage devices are widely used in the driver integrated circuits (ICs) of the LCD panels and the high voltage devices are fabricated using the complementary metal oxide semiconductor (CMOS) manufacturing processes. For the high voltage devices, the junction breakdown voltage of the source/drain region is raised by either forming the isolation layer to enlarge the distance between the source/drain region and the gate to lower the transversal electric field in the channel, or by performing lightly doping to the drift region under the isolation layer and the grade region under the source/drain region for relieving the hot electron effects.

For future advanced applications, it is acutely desirable to lower the power consumption of the driver ICs in the LCD panels.

SUMMARY OF THE INVENTION

Accordingly, at least one objective of the present invention is to provide a metal oxide semiconductor (MOS) device, applicable for the driver ICs of the LCD panels, that affords lower electricity consumption. The MOS device of the present invention can offer lower operating voltages and may work with the high voltage MOS devices in the high voltage device regions of the driver ICs.

To achieve these and other advantages and in accordance with the purpose of the invention, as embodied and broadly described herein, the present invention provides a metal oxide semiconductor (MOS) device. The MOS device comprises a substrate, at least an isolation structure, a deep N-type well, a P-type well, a gate, a plurality of N-type extension regions, an N-type drain region, an N-type source region and a P-type doped region. The N-type extension regions are disposed in the substrate at either side of the gate and between the isolation structures, while the N-type drain region and the N-type source region are respectively disposed in the N-type extension regions at both sides of the gate. The P-type well surrounds the N-type extension regions, and the P-type doped region is disposed in the P-type well of the substrate and is isolated from the N-type source region by the isolation structure.

According to one preferred embodiment of the present invention, the aforementioned N-type extension region further includes a double diffused region.

According to one preferred embodiment of the present invention, one side of the N-type extension region is aligned with the gate, while the other side of the N-type extension region is extended under the adjacent isolation structure. Alternatively, one side of the N-type extension region is extended under the gate, while the other side of the N-type extension region is extended under the isolation structure.

According to one preferred embodiment of the present invention, the aforementioned MOS device further includes a pair of spacers disposed on the both sidewalls of the gate. In addition, one side of the N-type source region or N-type drain region is adjoined with the spacer, while the other side of the N-type source region or N-type drain region is adjoined with the isolation structure.

According to one preferred embodiment of the present invention, the N-type extension region has a doping concentration smaller than that of the N-type source or drain region.

According to one preferred embodiment of the present invention, the depth of the N-type extension region is deeper than that of the N-type source or drain region.

According to one preferred embodiment of the present invention, the MOS device further includes an N-type doped region disposed in the deep N-type well.

Because the MOS device of the present invention includes the P-type well having a higher (electric) potential located between the N-type drain region and the substrate, the potential differences between the gate and source ($V_{GS}$) and drain and source ($V_{DS}$) is lowered, thus reducing the operating voltage and the power consumption.

On the other hand, as the operation voltage range is dropped, the design rule of the MOS device can be more flexible. Therefore, the device pitch can be further minimized or the device layout can be reduced in sizes. Since the MOS device of the present invention is operated under the lower voltage range, the N-type deep well is further included for ensuring the electrical isolation between the MOS device of the present invention and other high voltage MOS devices.

Furthermore, the method of fabricating the MOS device according to the present invention is compatible with existing CMOS process or DMOS process. Since there is no need for additional masks to fabricate the MOS device structure of the present invention, no additional production cost is incurred.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
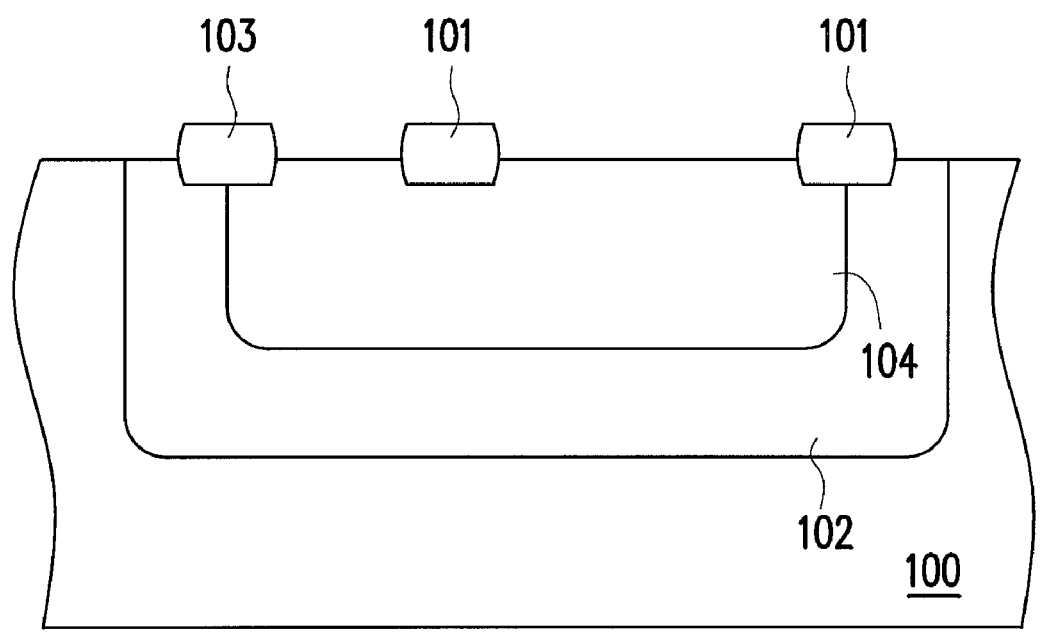
FIGS. 1A through 1D are schematic cross-sectional views showing the steps for fabricating a MOS transistor device according to one preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1D are schematic cross-sectional views showing the steps for fabricating a MOS transistor device according to one preferred embodiment of the present invention. As shown in FIG. 1A, a substrate 100 is provided. The substrate 100 is a P-type silicon substrate, for example. Then, an N-type deep well 102 is formed in the substrate 100. The method of forming the N-type deep well 102 includes performing an ion implant process using phosphorus as the dopants, for example. Thereafter, a P-type well 104 is formed in the N-type deep well 102 such that the N-type deep well 102 surrounds the P-well 104. The P-type well 104 is formed, for example, by performing an ion implant using boron as the dopants.

Thereafter, isolation structures 101 and 103 are formed in the N-type deep well 102 and P-type well 104. The isolation structure 101/103 is fabricated using silicon oxide, for example. The isolation structure 101/103 can be a field oxide layer formed, for example, by performing a thermal oxidation. As anyone knowledgeable in this area may notice that any structure or material with isolating capability can be used to form the isolation structure in the present invention. For example, the isolation structure 101/103 can be a shallow trench isolation (STI) structure.

Figure 1B:
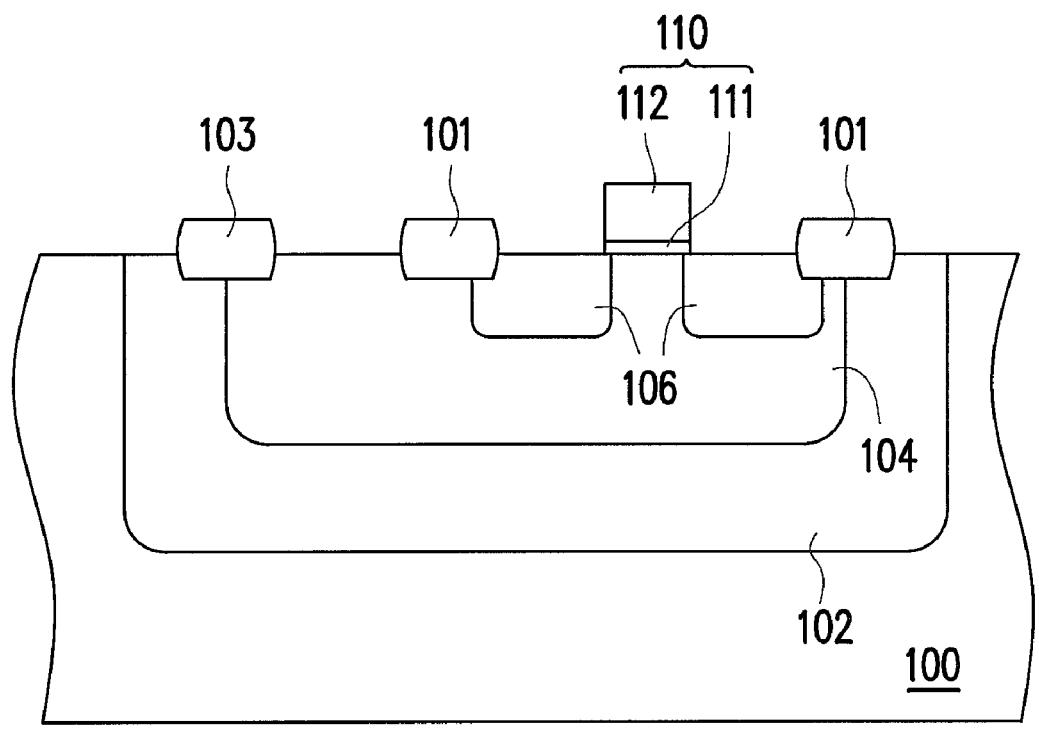

As shown in FIG. 1B, a gate structure 110 is formed on the substrate 100. The gate structure 110 includes a gate dielectric layer 111 and a polysilicon gate 112. The gate structure 110 is formed, for example, by forming a silicon oxide layer (not shown) by thermal oxidation, forming a doped polysilicon layer (not shown) by chemical vapor deposition process with in-situ doping, and patterning both layers by performing a photolithographic and etching process. Thereafter, using the gate structure 110 as the mask, an N-type extension region 106 is formed in the substrate 100 at both sides of the gate structure 100 and between the isolation structures 101. The N-type extension region 106 can be formed by, for example, double diffused technology using N-type dopants such as phosphorus or arsenic. As the gate structure 100 is used as the mask, the resultant N-type extension region 106 should be aligned with both sides of the gate structure 110. However, depending on the design requirements, the N-type extension region 106 can be further outwardly extended by performing annealing, for example, so that a portion of the N-type extension region 106 is located under the gate structure 110 and/or the isolation structure 101.

Figure 1C:
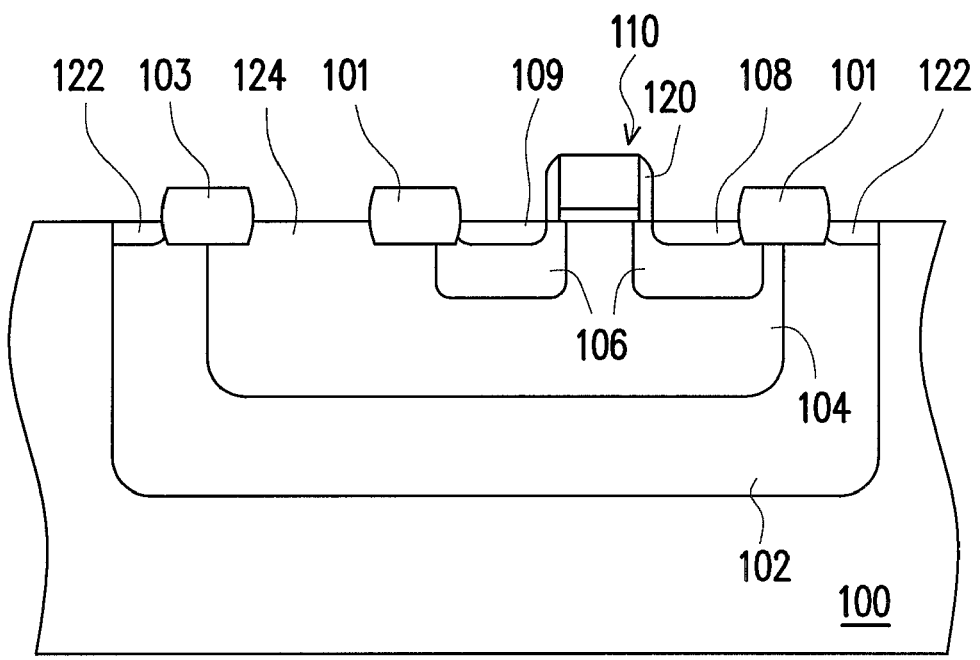

Thereafter, referring to FIG. 1C, spacers 120 are formed on the sidewalls of the gate structure 110. The spacers 120 are fabricated using silicon nitride, for example. The spacers 120 are formed, for example, by forming a spacer material layer (not shown) over the substrate and performing an etching back operation thereafter. Then, using the gate structure 110 and the spacers 120 thereon as the mask, an N-type drain region 108 and an N-type source region 109 are respectively formed in the substrate 100 between the spacers 120 and the isolation structure 101. The N-type drain region 108 and the N-type source region 109 are disposed in and surrounded by the N-type extension regions 106.

The N-type drain region 108 and the N-type source region 109 are adjoined with the neighboring isolation structures 101, but they may be extended sideways to be partially under the isolation structures 100 based on the design requirements. In principle, the N-type extension region 106 is larger in size and has a depth larger than that of the N-type drain region 108 and the N-type source region 109. However, the doping concentration of the N-type extension region 106 is averagely smaller than that of the N-type drain region 108 and the N-type source region 109. For example, the doping concentration of the N-type drain region 108 or the N-type source region 109 is between about $10^{14}$-$10^{17}$ cm$^{-3}$.

Optionally, N-type doped regions 122 are formed in the substrate 100, away from the gate structure 110, at two sides of the N-type deep well 102, simultaneously during the same step of fabricating the N-type drain region 108 and the N-type source region 109. The N-type doped region 122 is formed, for example, by performing an ion implant process using phosphorus as the dopants. The N-type doped region 122 has a doping concentration and depth similar to that of the N-type drain region 108 or the N-type source region 109. The N-type doped region 122 may function as the external terminal, for example, and a VDD (the system voltage) may be applied to the external terminal for better electrical isolation.

Figure 1D:
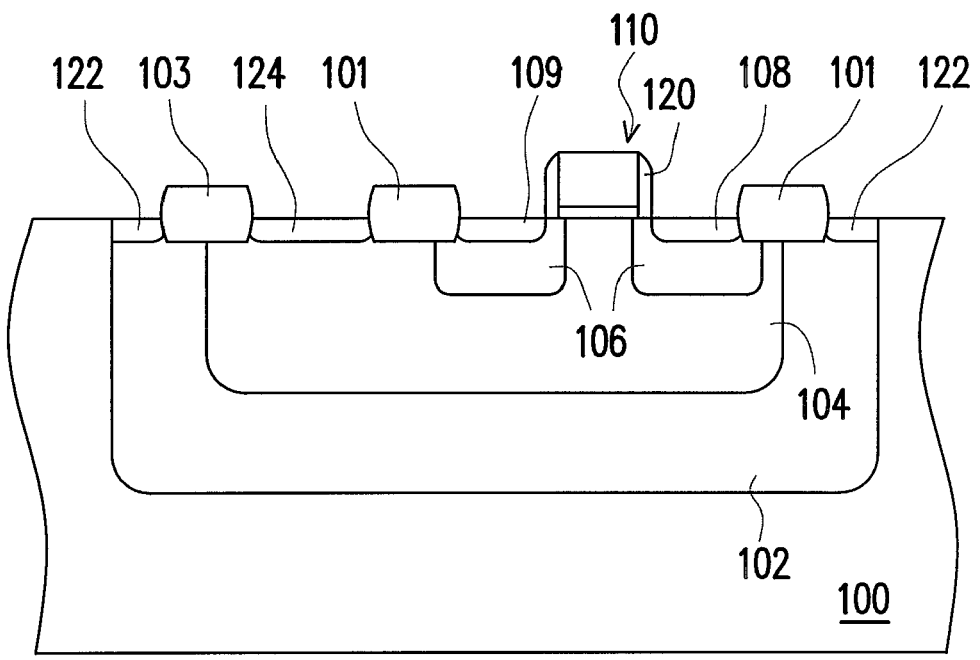

Referring to FIG. 1D, at least a P-type doped region 124 is formed in the P-type well 104 between the isolation structures 101 and 103. The P-type doped region 124 is formed, for example, by performing an ion implant process using boron as the dopants. The P-type doped region 124 has a depth similar to that of the N-type drain region 108 or the N-type source region 109. The P-type doped region 124 may function as the bulk contact, for example.

The aforementioned process steps for forming the doped regions or wells are merely exemplary, and one skilled in the art would understand that the order of the steps or their settings can be modified according to the device design or layout requirements. The aforementioned process steps or methods of forming the MOS device are compatible with the existing CMOS process and may be incorporated into the conventional process without using additional photomask. For the above embodiments, the NMOS device is used as an example for descriptions, but not intended for limiting the scope of the present invention.

Figure 2A:
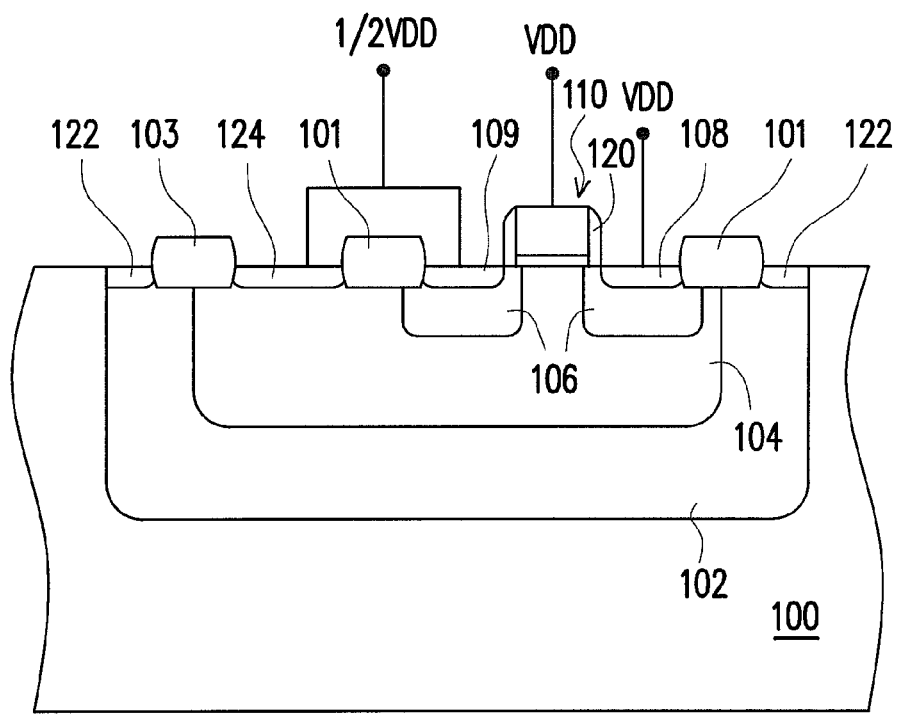
FIG. 2A is a schematic cross-sectional view of a MOS device according to one preferred embodiment of the present invention.
Figure 2B:
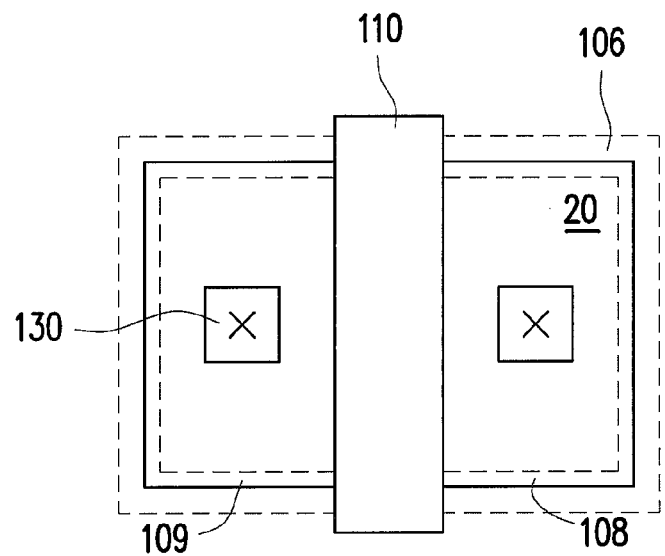
FIG. 2B is an example of a schematic top layout view showing a portion of a MOS device according to one preferred embodiment of the present invention.

FIG. 2A is a schematic cross-sectional view of a MOS device according to one preferred embodiment of the present invention. FIG. 2B is an example of a schematic top layout view showing a portion of a MOS device according to one preferred embodiment of the present invention. As shown in FIGS. 2A & 2B, the MOS device 10 in the present invention comprises the substrate 100, isolation structures 101 & 103, the deep N-type well 102, the P-type well 104, the gate structure 110, the spacers 120, the N-type extension regions 106, the N-type drain region 108, the N-type source region 109 and the P-type doped region 124.

From FIG. 2B, the exemplary relative positions of the gate structure 110, the N-type extension regions 106, the N-type drain region 108 and the N-type source region 109 are illustrated. The active region 20 defined by isolations structures 101 and 103 is shown in solid line. The gate structure 110 is disposed on the substrate 100, while the N-type drain region 108 and the N-type source region 109 are respectively disposed in the substrate 100 at either side of the gate structure 110 and are adjoined with the isolation structures 101. The N-type extension regions 106 are disposed in the substrate 100 at either side of the gate structure 110 and below the N-type drain region 108 and the N-type source region 109. The N-type drain region 108 and the N-type source region 109 are surrounded by the N-type extension regions 106. There are contacts 130 located in the N-type drain region 108 and the N-type source region 109.

As shown in FIG. 2A, the P-type doped region 124 is disposed in the P-type well 104 of the substrate 100 between the isolation structures 101 and 103 and is isolated from the N-type source region 109 by the isolation structure 101. The P-type well 104 surrounds the N-type extension regions 106, the N-type drain region 108, the N-type source region 109 and the P-type doped region 124. The N-type deep well 102 completely encircles and surrounds the P-type well 104, so that the MOS device 10 is electrically isolated from the other devices in the substrate 100 by the N-type deep well 102.

For the common high voltage NMOS device in operation, the source and the bulk are grounded (GND), while VDD (the system voltage) is applied to the gate and the drain. For the NMOS device of this invention, due to the existence of the P-type well (lightly doped region) 104 for raising the bulk potential (i.e. the P-type lightly doped region 104, with the potential of ½ VDD, considered as the bulk of the NMOS), the N-type source region 109 and the P-type doped region 124 have the potential of ½ VDD. Hence, either the potential difference between the N-type source region 109 and the gate 110, the potential difference between the N-type drain region 108 and the N-type source region 109, or the potential difference between the N-type drain region 108 and the P-type well 104 is decreased to ½ VDD.

Clearly, the design of the MOS structure can effectively reduce the operating voltage range (e.g. from high operating voltage range to the middle operating voltage range) and lower the electricity consumption. Moreover, because the operating voltage range is lower, the design rule of the device can be more flexible. The pitch between the devices can be shrunk down, and the layout area of the devices can be diminished.

The MOS device provided by the present invention can be used in the driver integrated circuits of the LCD panels to partially replace a selection of high voltage devices, thus lowering the electricity consumption and saving power.

The process steps and methods used for fabricating the MOS device are compatible with the existing CMOS process and no additional mask or process steps are required. Hence, the MOS device of the present invention can be fabricated together with the high voltage MOS devices without additional expenses. In addition, the MOS device of this invention includes the P-type well region with a higher potential and the operating voltage range can be effectively lowered to cut the electricity consumption. The MOS structure of this invention is properly electrically isolated from the other high voltage devices by the N-type deep well.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A metal oxide semiconductor (MOS) device, comprising:
    a substrate having an N-type deep well and a plurality of isolation structures;
    a P-type well disposed in the N-type deep well, wherein the P-type well has a potential of ½ VDD;
    a gate structure disposed on the substrate and within the P-type well, wherein VDD is applied to the gate structure;
    a plurality of N-type extension region disposed in the P-type well, between the isolation structures and at either side of the gate structure;
    an N-type drain region and an N-type source region respectively disposed in the N-type extension regions and respectively disposed in the substrate at either side of the gate structure; and
    a P-type doped region disposed in the substrate and in the P-type well, wherein VDD is applied to the N-type drain region, the N-type source region and the P-type doped region are electrically connected to the P-type well having a potential of ½ VDD, so that the N-type source region and gate structure have a potential difference of ½ VDD, the N-type drain region and the N-type source region have a potential difference of ½ VDD, the N-type drain region and the P-type well have a potential difference of ½ VDD.

2. The MOS device of claim 1, wherein the N-type extension region further includes a double diffused region.

3. The MOS device of claim 1, wherein one side of the N-type extension region is aligned with the gate structure, while the other side of the N-type extension region is extended under the adjacent isolation structure.

4. The MOS device of claim 1, wherein one side of the N-type extension region is extended under the gate structure, while the other side of the N-type extension region is extended under the adjacent isolation structure.

5. The MOS device of claim 1, further comprising a pair of spacers disposed on both sidewalls of the gate structure, one side of the N-type drain region is adjoined with the spacer and the other side is adjoined with the adjacent isolation structure, and one side of the N-type source region is adjoined with the spacer and the other side is adjoined with the adjacent isolation structure.

6. The MOS device of claim 1, wherein the N-type extension region has a doping concentration smaller than that of the N-type source region or the N-type drain region.

7. The MOS device of claim 1, wherein the N-type extension region has a depth greater than that of the N-type source region or the N-type drain region.

8. The MOS device of claim 1, further comprising at least an N-type doped region disposed in the substrate in the N-type deep well.

9. The MOS device of claim 8, where VDD is applied to the N-type doped region disposed in the substrate in the N-type deep well.

* * * * *